(12) United States Patent  
Benwadih et al.

(10) Patent No.: US 9,349,972 B2
(45) Date of Patent: May 24, 2016

(54) PHOTODETECTOR HAVING A BUILT-IN MEANS FOR CONCENTRATING VISIBLE RADIATION AND CORRESPONDING ARRAY

(71) Applicants: Commissariat a l'Energie Atomique et aux Energies Alternatives, Paris (FR); ISORG, Grenoble (FR)

(72) Inventors: Mohammed Benwadih, Champigny sur Marne (FR); Anis Daami, Grenoble (FR); Jamal Tallal, Grenoble (FR)

(73) Assignees: Commissariat a l'Energie Atomique et aux Energies Alternatives, Paris (FR); ISORG, Grenoble (FR)

( * ) Notice: Subject to any disclaimer, the term of this patent is extended or adjusted under 35 U.S.C. 154(b) by 0 days.

(21) Appl. No.: 14/409,682

(22) PCT Filed: Jun. 21, 2013

(86) PCT No.: PCT/IB2013/055108
§ 371 (c)(1),
(2) Date: Dec. 19, 2014

(87) PCT Pub. No.: WO2013/190515
PCT Pub. Date: Dec. 27, 2013

(65) Prior Publication Data
US 2015/0228920 A1 Aug. 13, 2015

(30) Foreign Application Priority Data

Jun. 21, 2012 (FR) ...................................... 12 55858

(51) Int. Cl.
H01L 29/26 (2006.01)
(Continued)

(52) U.S. Cl.
CPC ............ *H01L 51/442* (2013.01); *H01L 27/307* (2013.01); *H01L 51/447* (2013.01); *Y02E 10/549* (2013.01); *Y02P 70/521* (2015.11)

(58) Field of Classification Search
CPC .. C09K 11/06; A61B 5/14552; A61B 5/1455; A61B 5/02427; G06F 3/042; C08G 2261/91; H01L 27/14625; H01L 31/0232; H01L 31/101; H01L 51/42; H01L 31/09; H01L 27/305; G01J 1/44
USPC ........... 257/80, 225, 222, 226, 257, 293, 290, 257/414, 444; 438/22, 29, 48, 71, 82
See application file for complete search history.

(56) References Cited

U.S. PATENT DOCUMENTS

2007/0164297 A1* 7/2007 Oda et al. ......................... 257/93
2009/0255586 A1* 10/2009 Kim et al. ...................... 136/263
2012/0125413 A1 5/2012 Son et al.

OTHER PUBLICATIONS

Wang et al., "Effect of the ordered 2 D-dot nano-patterned anode for polymer solar cells," Organic Electronics, 11: 285-290 (2010).
(Continued)

*Primary Examiner* — Hsien Ming Lee
(74) *Attorney, Agent, or Firm* — Morgan, Lewis & Bockius LLP

(57) ABSTRACT

An organic photodetector comprising a first electrode (11 to 31) that is plane and formed on a substrate (10 to 30) that is plane, a convex active layer (12 to 32) formed on the first electrode, and a second electrode (13 to 33) formed on the active layer, means for concentrating light radiation in the active layer being incorporated in the photodetector.

11 Claims, 4 Drawing Sheets

| (51) | Int. Cl. | |
|---|---|---|
| | *H01L 29/768* | (2006.01) |
| | *H01L 29/80* | (2006.01) |
| | *H01L 31/062* | (2012.01) |
| | *H01L 21/00* | (2006.01) |
| | *H01L 51/44* | (2006.01) |
| | *H01L 27/30* | (2006.01) |

(56) References Cited

OTHER PUBLICATIONS

International Search Report issued in corresponding International Patent Application No. PCT/IB2013/055108 dated May 26, 2014.
Written Opinion issued in corresponding International Patent Application No. PCT/IB2013/055108 dated May 26, 2014.

* cited by examiner

PHOTODETECTOR HAVING A BUILT-IN MEANS FOR CONCENTRATING VISIBLE RADIATION AND CORRESPONDING ARRAY

The invention relates to the field of organic photodetectors.

The operating principle of such a photodetector is to capture the light rays it receives and convert them into electric current.

A photodetector conventionally comprises an active layer situated between two electrodes, the stack being arranged on a substrate, in particular a glass substrate.

A photon reaching the active layer becomes dissociated into an electron/hole pair. This pair becomes separated because an external electric field is applied. Thus, electrons are collected by the positive electrode and holes by the negative electrode, thereby generating an electric current.

Photodetectors were initially obtained by using silicon technologies.

More recently, photodetectors have been developed that incorporate organic material. Such photodetectors can easily be deployed over large areas and they present performance comparable to the performance of silicon. Finally, photodetectors are relatively inexpensive to fabricate, because of the flexible substrate technology that is used.

Such an organic photodetector may present a structure that is horizontal. In this respect, reference may be made in particular to Document US 2005/0179031. Such a photodetector may also present a structure that is vertical, as illustrated by Document US 2006/0060239.

At present, the structure in the most widespread use consists in a vertical stack of organic and non-organic layers.

Such organic photodetectors are limited in performance. Solutions have therefore been sought for increasing their efficiency.

Such an increase requires optimizing the collection of incident light in order to be able to convert a maximum number of photons into electron/hole pairs, and thus collect a maximum number of electrons and holes at the electrodes in order to increase the electric current that is generated.

The solutions proposed in the state of the art consist in providing lenses on the photodetector in order to concentrate light rays onto the photodetector. Reference may be made in particular to the article by Y. Ishihara et al. "A high photosensitivity IL-CCD image sensor with monolithic resin lens array", IEEE 1983, pp. 497-500.

Those solutions enable an increase of about 25% to be achieved compared with a photodetector having no lens, and they provide satisfaction.

Nevertheless, the presence of such lenses complicates fabrication of the device in question since it involves a specific step. Furthermore, that step must be performed in such a manner as to obtain lenses that present the same optical properties. That therefore increases cost.

An object of the invention is to mitigate those drawbacks by proposing a photodetector of increased performance and that can be obtained by a fabrication method that is simple to implement and that is therefore relatively low in cost.

Thus, the invention provides an organic photodetector suitable for being exposed to light radiation, the photodetector comprising a first electrode that is plane and formed on a substrate that is plane, a convex active layer formed on the first electrode, and a second electrode formed on the active layer, means for concentrating light radiation in the active layer being incorporated in the photodetector.

Under such circumstances, and in a first embodiment, the active layer is deposited on the first electrode and coats it, while the second electrode deposited on the active layer is convex.

Advantageously, both the first electrode and the substrate are transparent, and the second electrode is reflective.

It is also possible to make provision for the first electrode to be made of metal and the second electrode to be transparent.

In a second embodiment, the substrate is transparent, the first electrode is indented to form a convex cavity, and the active layer is deposited in this cavity.

In a variant, the invention also provides an organic photodetector comprising a first electrode formed on a plane substrate, a convex active layer formed on the first electrode, and a second electrode formed on the active layer, means for concentrating light radiation in the active layer being incorporated in the photodetector, wherein the substrate is transparent and indented in order to form a convex cavity, the first electrode is convex and consists in a layer deposited in said cavity, and the active layer is also deposited in the cavity, on the first electrode.

These two variants of the invention seek to solve the same technical problem, namely incorporating in the photodetector means for concentrating radiation in the active layer.

When the active layer is present in a cavity formed in the first electrode or in the substrate, the second electrode is plane.

Also under such circumstances, electrical insulation is advantageously provided between the first and second electrodes.

The invention also provides an array made up of a plurality of photodetectors of the invention.

When each photodetector has an active layer in a cavity formed in the first electrode or in the substrate, the first electrode may be common to all of the photodetectors.

In a variant embodiment of this array, the photodetectors may be electrically insulated from one another.

The invention can be better understood and other objects, advantages, and characteristics thereof appear more clearly on reading the following description which is made with reference to the accompanying drawings, in which.

Elements appearing in more than one of the figures are given the same references in each of them.

Figure 1:
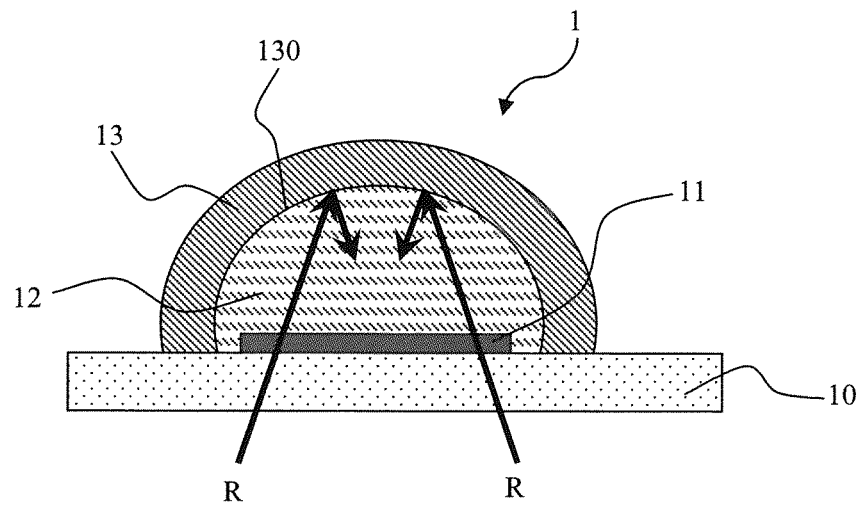
FIG. 1 is a section view of a photodetector of the invention in which the light radiation concentration means consist in a mirror.

FIG. 1 shows a first embodiment of a photodetector of the invention that incorporates light radiation concentration means acting as a mirror.

The photodetector 1 has a substrate 10 that is plane and transparent. The substrate may equally well be flexible or rigid. In particular it may be made of glass or of plastics material, e.g. polyethylene naphthalate or polyethylene terephthalate.

A transparent electrode 11 is deposited on the substrate 10. This conductive electrode 11 may be in particular out of indium tin oxide (ITO), or zinc oxide (ZnO), or antimony tin oxide (ATO), or gallium zinc oxide (GZO), or indeed of aluminum zinc oxide (AZO). As shown in FIG. 1, the electrode 11 is deposited locally on the substrate and its thickness is relatively small.

The electrode 11 is plane and it is coated in an active layer 12 of shape that is convex, or even hemispherical.

The active layer comprises an electronic acceptor material and an electronic donor material, such as Poly(3,4-ethylene-dioxythiophene) polystyrene sulfonate (PEDOT:PSS).

It may constitute a heterojunction for these two materials, being in the form of a layer or a stack of a plurality of layers.

Finally, the photodetector 1 has a second electrode 13 in the form of a layer that fits closely to the outside shape of the active layer 12 and that thus likewise presents a shape that is convex.

The electrode 13 has the ability to reflect at least on its hemispherical interface 130 with the active layer 12.

Thus, this electrode 13 may be a metal electrode. In particular, it may be made of silver or of aluminum.

The electrode 13 may equally well be made of any material, providing a layer of reflective material is arranged at the interface 130 between the electrode 13 and the active layer 12. The reflective layer may in particular be a layer of metal. In particular, it may be made of Ag, Ni, or Cr.

By way of illustration, the thicknesses of the various layers lie in the range 100 nanometers (nm) to 250 nm. The external surface area of the layers 12 and 13 lies in the range 100 square micrometers ($\mu m^2$) to 1 square millimeter ($mm^2$).

The photodetector operates as follows.

Its substrate 10 is exposed to light radiation represented by arrows referenced R in FIG. 1. Insofar as a light beam passes through the active layer 12 without being absorbed, it is reflected on the electrode 13 and passes once more through the active layer.

This reflection obtained using the reflective second electrode 13 serves to increase the number of photons that can become dissociated into an electron/hole pair. Since certain photons may pass through the active layer without being absorbed, the performance of the photodetector is thus augmented.

Figure 2:
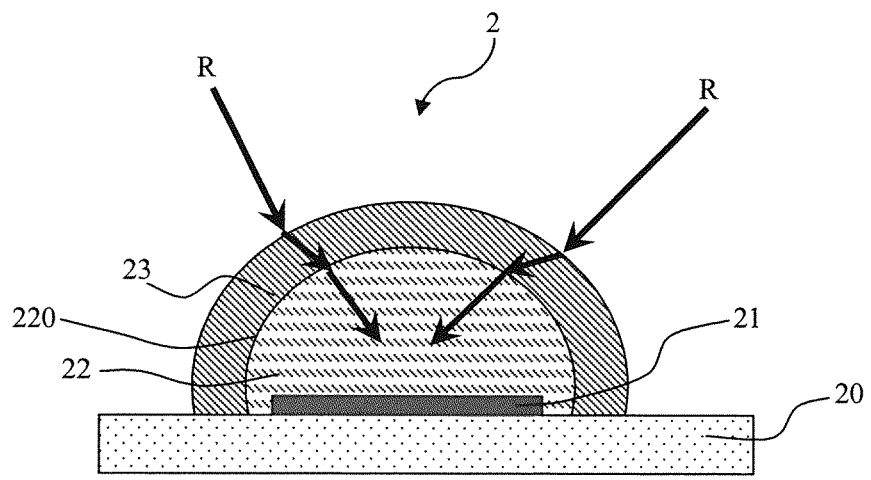
FIGS. 2 to 4 are section views of photodetectors of the invention in which the light radiation concentration means consists in a lens.

FIG. 2 is a section view of another embodiment of a photodetector of the invention of structure that incorporates means for concentrating light radiation in the active layer. Its dimensions are identical to those of the photodetector shown in FIG. 1.

This photodetector 2 comprises a transparent substrate 20 on which there is formed a first electrode 21, which is plane. As shown in FIG. 2, the electrode does not cover the substrate completely. As in the photodetector 1, it is the result of localized deposition of its component material onto the substrate 20.

The electrode 21 is coated in an active layer 22 of hemispherical shape, its outer surface 220 thus being convex in shape.

Finally, a second electrode 23 is formed on the active layer 22. It is in the form of a layer of substantially constant thickness that fits closely to the convex shape of the outer surface 220 of the active layer 22. This electrode 23 is transparent.

Wettability treatment may be provided on the active layer 22 before forming the second electrode. Such treatment serves to ensure that the layer 22 is covered completely by the second electrode.

The photodetector 2 operates as follows.

The second electrode 23 is exposed to light radiation, represented by arrows referenced R in FIG. 2.

The second electrode 23 then acts as a converging lens so as to concentrate the light rays on the active layer 22.

In addition, if the electrode 21 possesses the ability to reflect, then it is capable of returning into the active layer any photons that have passed through it without being absorbed. This improves the performance of the photodetector. The electrode 21 may be made in particular out of metal.

Thus, the photodetector 2 has a second electrode that acts as a converging lens, in order to improve its efficiency.

Efficiency is further increased when the first electrode has the ability to reflect.

It may be considered that this photodetector presents substantially the same performance as a plane photodetector on which an independently fabricated lens has been provided. Nevertheless, its fabrication is simplified since the lens is incorporated in the photodetector and the cost of obtaining it is thus lower than the cost of a plane photodetector associated with an independently fabricated lens.

Figure 3:
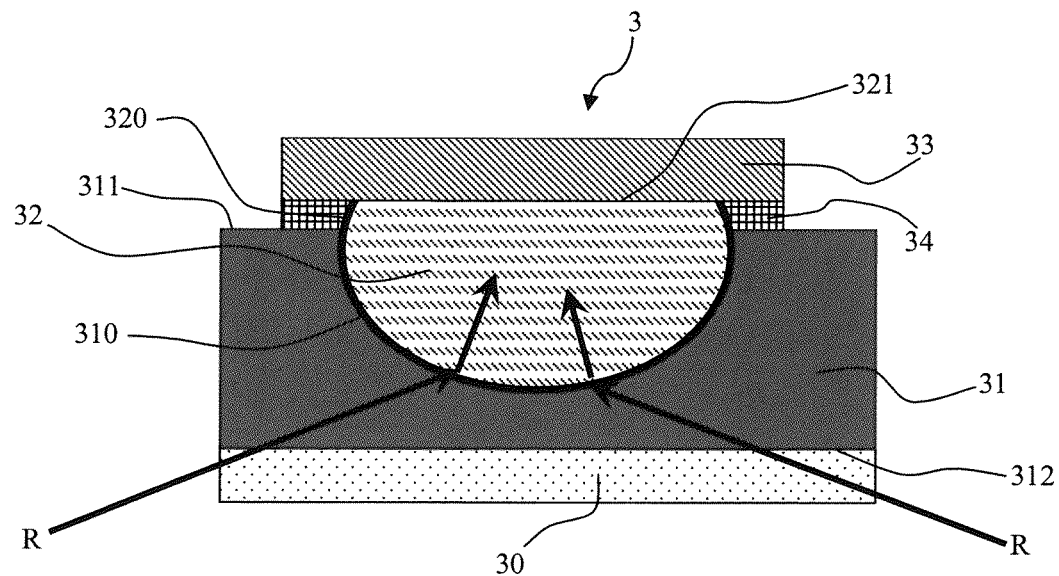

FIG. 3 is a section view of another photodetector 3 that also has a lens that is directly incorporated in its structure.

The photodetector 3 has a transparent substrate 30. The substrate may optionally be flexible.

The substrate 30 has an electrode 31 deposited thereon.

This electrode 31 is plane. Nevertheless, unlike the embodiments shown in FIGS. 1 and 2, it covers the substrate completely and it is of considerable thickness. This electrode 31 is etched so as to form a cavity of convex shape.

Furthermore, the electrode 31 is made of a material that is transparent.

An active layer 32 is arranged in the cavity formed in the electrode 31. This active layer thus fits closely to the convex shape of the wall 310 of the cavity formed in the first electrode 31.

The wall 310 may be subjected to wettability treatment prior to depositing the active layer 32. This ensures that the wall 310 is well covered in the active layer.

As shown in FIG. 3, the active layer 32 is formed so as to extend beyond the face 311 of the first electrode 31, i.e. beyond its face that is opposite from its face 312 that is in contact with the substrate 30. It is into this face 311 that the cavity formed in the first electrode opens out.

Thus, the active portion 32 presents a convex wall 320 that is in contact with the entire convex surface of the wall 310 of the cavity made in the first electrode 31. The active layer also has a wall 321 that is substantially plane and that closes the convex wall 320.

This plane wall extends beyond the surface 311 of the first electrode 31. The second electrode 33 is formed on this surface 321. It is in the form of a layer that is plane and of substantially constant thickness.

As shown in FIG. 3, the two electrodes 31 and 33 are insulated from each other by means of insulation 34.

By way of illustration, the thicknesses of the various layers lie in the range 100 nm to 250 nm and the surface area of the wall 310 lies in the range 100 $\mu m^2$ to 1 $mm^2$.

The photodetector 3 operates as follows.

The substrate 30 is exposed to light radiation that is represented by the two arrows referenced R in FIG. 3. Since the substrate 30 and the first electrode 31 are transparent, the light radiation passes through them. The convex shape of the wall 310 acts on the light rays like a converging lens so as to concentrate the light in the active layer 32. The photodetector 3 thus includes a lens incorporated in its structure, which lens is obtained during fabrication of the photodetector. The performance of the photodetector 3 is thus increased.

Insofar as the second electrode 33 is reflective, it acts like a mirror. It is then capable of returning into the active layer any light rays that might pass through it without being absorbed. The performance of the photodetector 3 is thus further increased.

This applies in particular when the electrode 3 is made of a metal material or when it includes a reflective layer on its surface 321 that is partially in contact with the active layer 32.

Figure 4:
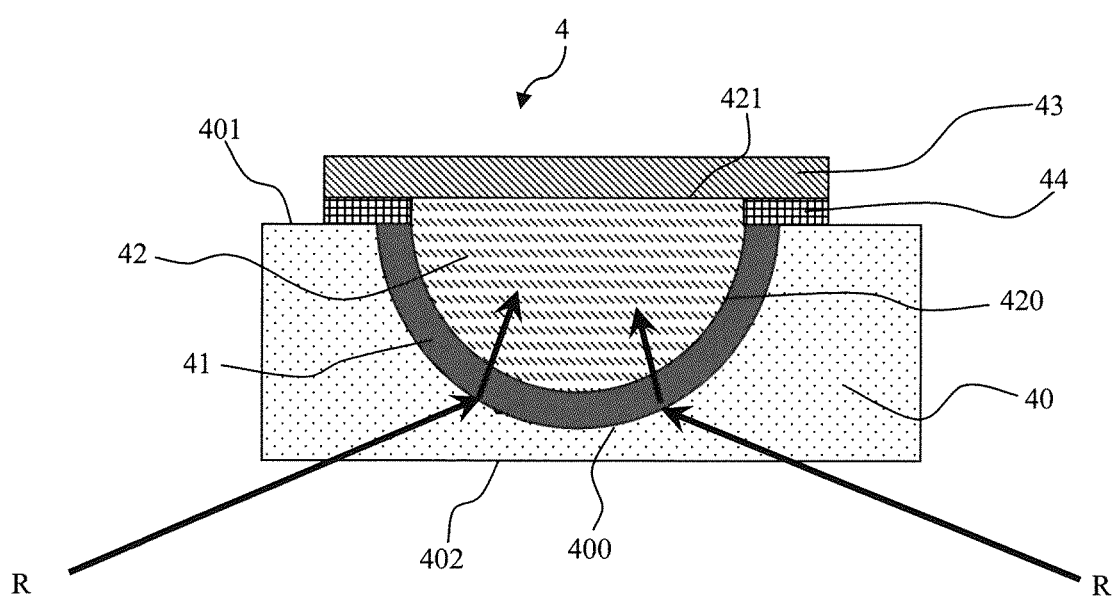

FIG. 4 is a section view of another photodetector 4 that likewise incorporates a converging lens.

The dimensions of this photodetector are similar to those of the photodetector of FIG. 3.

The photodetector 4 has a transparent substrate 40 that is preferably rigid.

This substrate is etched in order to form a cavity of convex shape, which cavity is defined by a surface 400 that is likewise of convex shape.

It is also possible to envisage making the substrate out of a flexible plastics material by molding so that it includes such recesses directly.

A layer 41 of transparent material of substantially constant thickness is formed on the wall 400. This layer 41 constitutes the first electrode of the photodetector and likewise presents a shape that is convex.

Before forming the layer 41, the wall 400 may be subjected to wettability treatment.

An active layer 42 is then deposited on the first electrode 41. The active layer fills the remainder of the cavity formed in the substrate 40 and it extends beyond the surface 401 of the substrate 40 into which the cavity that is formed in the substrate opens out.

Thus, the active layer is defined by a hemispherical wall 420 and by a substantially plane wall 421 which closes the wall 420.

A second electrode 43 is formed on the surface 421. It is in the form of a layer that is plane and of thickness that is substantially constant.

Finally, the two electrodes 41 and 43 are electrically insulated from each other by insulation 44.

The photodetector 4 operates as follows.

It is the surface 402 of the substrate 40 that is remote from the surface 401 that is exposed to light radiation. This is represented by arrows referenced R in FIG. 4.

Light rays pass through the substrate 40, which is transparent. The convex surface 400 of the cavity formed in the substrate acts as a converging lens. The light rays thus pass through the transparent substrate 41 to converge in the active portion 42.

Once more, the photodetector 4 includes a lens that is incorporated in its structure and that is obtained directly during fabrication of the photodetector. Because of the presence of this lens, the performance of the photodetector is increased.

When the electrode 43 is reflective, any light rays that are not absorbed by the active layer are reflected by the electrode 43 and returned into the active layer.

This enables the performance of the photodetector to be increased further.

Reference is now made to FIGS. 5 to 8, which are all section views showing respective arrays made using photodetectors of the invention.

Figure 5:
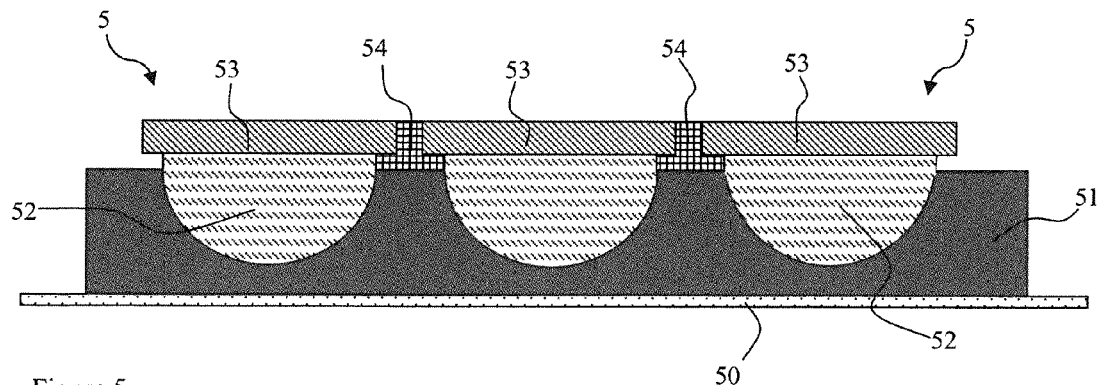
FIGS. 5 and 6 are section views diagrammatically showing an array made up of photodetectors of the invention each incorporating a lens, the array presenting a common electrode for all of the photodetectors.

The array shown in FIG. 5 has a plurality of photodetectors 5 of the kind shown in FIG. 3.

Thus, this array comprises a transparent substrate 50 and a first electrode 51, which is likewise transparent, and in which a plurality of cavities are formed (there being three cavities shown in FIG. 5).

Active layers 52 are formed in these cavities. Second electrodes 53 are formed on each active layer 52, the second electrodes all presenting thickness that is substantially constant.

All of the electrodes 53 are insulated from one another by electrical insulation 54.

Thus, in the array shown in FIG. 5, the first electrode 51 is common to all of the photodetectors.

By way of illustration, the surface area of an active layer 52 facing one or the other of the electrodes 51 or 53 lies in the range 1 $\mu m^2$ to 1 $mm^2$.

Figure 6:
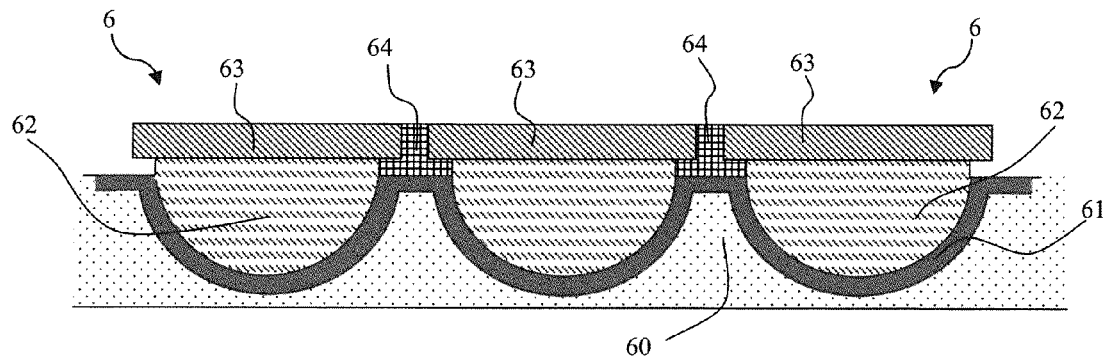

FIG. 6 shows another array comprising a plurality of photodetectors 6 similar to the photodetector 4 shown in FIG. 4.

Thus, this array comprises a substrate 60 with a plurality of hemispherical cavities in which a first electrode 61 is made.

In the array shown in FIG. 6, the layer of transparent material forming the first electrode is deposited continuously from one cavity to another. This array thus has a first electrode 61 that is common to all of the photodetectors in the array.

By way of illustration, the surface area of the active layer 62 facing the electrode 61 lies in the range 1 $\mu m^2$ to 1 $mm^2$, depending on the application.

Each photodetector also has an active layer 62 formed on the first electrode so as to fill the cavity made in the substrate.

Each active portion supports an electrode 63 formed by a layer that is plane and of thickness that is substantially constant. The electrodes 63 are electrically insulated from one another and also from the first electrode 61 by insulating material 64.

Figure 7:
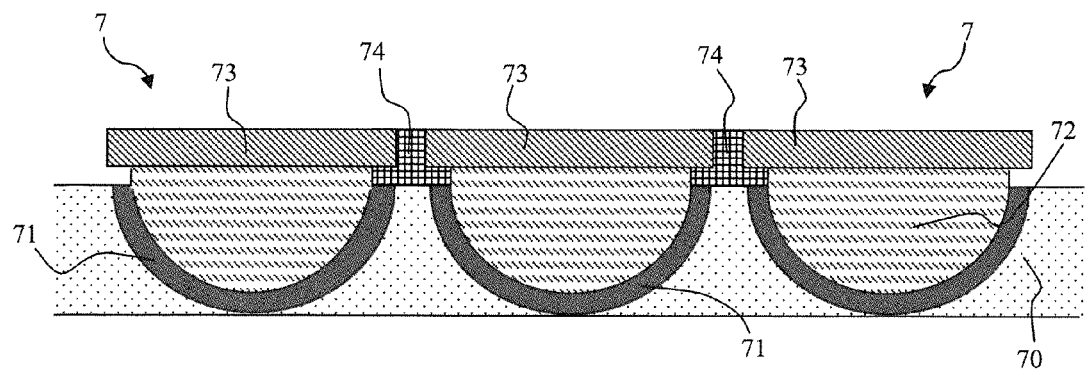
FIG. 7 is a section view of an array comprising photodetectors of the invention each incorporating a lens and all electrically insulated from one another.

FIG. 7 shows a variant of FIG. 6 in which the first electrode is not continuous. On the contrary, each photodetector 7 has its own first electrode 71 that is formed in a cavity of the substrate 70 and that is electrically insulated from the first electrode of an adjacent photodetector by means of electrical insulation 74.

The electrical insulation 74 also serves to insulate from one another the second electrodes 73 that are formed on the active portions 72 of the photodetectors.

Figure 8:
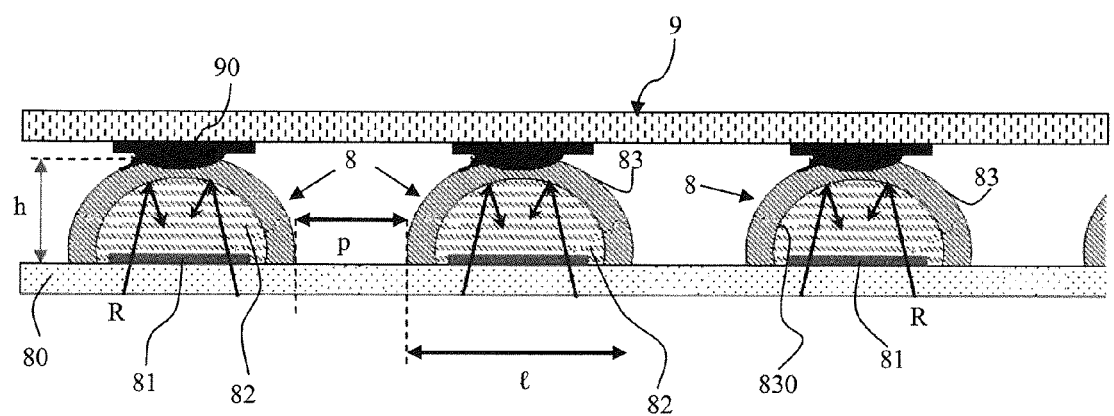
FIG. 8 is a section view of an array comprising photodetectors of the invention each incorporating a mirror and together presenting a common electrode.

The array shown in FIG. 8 has a plurality of photodetectors 8, as shown in FIG. 1.

Thus, this array has a substrate 80 that is plane and transparent and on which there are formed a plurality of photodetectors 8 (there being three of them in FIG. 5).

Each photodetector 8 has an electrode 81 that is transparent. It is plane and coated in an active layer 82 of hemispherical shape.

The second electrode 83 of each photodetector matches the outside shape of the active layer 82 and thus likewise presents a shape that is convex.

The electrode 83 presents reflective power at least at its hemispherical interface 830 with the active layer 82.

In the embodiment shown in FIG. 8, an electrical connection is made with the second electrodes 83 by connection means 9. These connection means may consist in another substrate or in an insulating layer including connections 90 for connecting together the second electrodes.

By way of example, the photodetectors 8 present a height h lying in the range 100 nm to 1 micrometer ($\mu m$).

The pitch p between two photodetectors 8 lies in the range 50 $\mu m$ to 1 millimeter (mm).

The width l of each photodetector, defined as its "footprint" on the substrate 80, lies in the range 100 $\mu m$ to 1 mm.

Finally, the substrate 80 may be made of polyethylene naphthalate. Its thickness may be about 125 μm.

In general, the first electrode of photodetectors of the invention may be deposited on the substrate in particular by using a spraying technique.

The active layer may be obtained in particular by ink jet or by a dispensing technique. In order to obtain a deposit that is hemispherical in shape, it is necessary for the solution that is deposited to present sufficient viscosity.

In general, the deposited solution is based on a polymer and a solvent, and the concentration of the polymer constituting the active layer should be greater than 40 milligrams per milliliter (mg/mL).

By way of example, it is possible to use a solution comprising 50 milligrams (mg) of PEDOT:PSS in 1 milliliter (mL) of water. Under such circumstances, depositing this solution by means of a spray or an ink jet leads to drops being deposited that are hemispherical in shape.

Obtaining a hemispherical shape can be facilitated by controlling the surface energy of the substrate. Thus, hydrophobic treatment makes it possible to emphasize the spherical nature of each drop deposited on the substrate.

When the active layer comprises a plurality of layers, the first deposition leads to a hemisphere being formed, and the following deposition fits closely to that shape, and so on.

Finally, the second substrate may be formed by a vacuum deposition technique or indeed by a printing technique.

The reference signs that appear in the claims are solely for the purpose of making them easier to understand and are not limiting on their scope.

The invention claimed is:

1. An organic photodetector comprising a first electrode that is plane and formed on a substrate that is plane, a convex active layer formed on the first electrode, and a second electrode formed on the convex active layer, a lens or mirror for concentrating light radiation in the convex active layer being incorporated in the photodetector.

2. An organic photodetector according to claim 1, wherein the convex active layer is deposited on the first electrode and coats the first electrode, while the second electrode is convex.

3. An organic photodetector according to claim 2, wherein the first electrode and the substrate are transparent, and the second electrode is reflective.

4. An organic photodetector according to claim 2, wherein the first electrode is made of metal and the second electrode is transparent.

5. An organic photodetector according to claim 1, wherein the substrate is transparent, the first electrode is indented to form a convex cavity, and the convex active layer is deposited in the convex cavity.

6. An organic photodetector comprising a first electrode formed on a plane substrate, a convex active layer formed on the first electrode, and a second electrode formed on the convex active layer, a lens or mirror for concentrating light radiation in the convex active layer being incorporated in the organic photodetector, wherein the substrate is transparent and indented in order to form a convex cavity, the first electrode is convex and consists in a layer deposited in said convex cavity, and the convex active layer is deposited in the convex cavity on the first electrode.

7. An organic photodetector according to claim 5, wherein the second electrode is plane.

8. An organic photodetector according to claim 5, wherein electrical insulation is provided between the first and second electrodes.

9. An array comprising a plurality of organic photodetectors according to claim 1.

10. An array according to claim 9, wherein each organic photodetector includes an active layer formed in a cavity of the first electrode or of the substrate, and wherein the first electrode is common to all of the organic photodetectors.

11. An array according to claim 9, wherein each organic photodetector comprises an active layer in a cavity formed in the substrate, with each of the organic photodetectors being electrically insulated from one another.

* * * * *